United States Patent
Sage et al.

(10) Patent No.: US 6,716,371 B1
(45) Date of Patent: Apr. 6, 2004

(54) CONDUCTING POLYMERS

(75) Inventors: Ian C Sage, Worcester (GB); Emma L Wood, Worcester (GB); Stephen J Till, Worcester (GB); William J Feast, Durham (GB); Richard J Peace, Bedford (GB)

(73) Assignee: Qinetiq Limited, Hants (GB)

( * ) Notice: Subject to any disclaimer, the term of this patent is extended or adjusted under 35 U.S.C. 154(b) by 0 days.

(21) Appl. No.: 09/959,617

(22) PCT Filed: May 3, 2000

(86) PCT No.: PCT/GB00/01692
§ 371 (c)(1),
(2), (4) Date: Nov. 6, 2001

(87) PCT Pub. No.: WO00/70692
PCT Pub. Date: Nov. 23, 2000

(30) Foreign Application Priority Data

May 12, 1999 (GB) .............................. 9910964

(51) Int. Cl.[7] .......................... H01B 1/12; H01L 51/20; H01L 51/30
(52) U.S. Cl. ................. 252/500; 252/62.3 Q; 428/620; 257/40
(58) Field of Search ................ 252/500, 62.3 Q; 428/620, 922; 257/40; 361/230

(56) References Cited

FOREIGN PATENT DOCUMENTS

DE 14 97 121 4/1969
EP 09001174 3/1999

OTHER PUBLICATIONS

Yamamoto, T. et al.; "Polymer Light–Emitting Diodes With Single–And Double–Layer Structures Using Poly (2,3–Diphenylquinoxaline–5,8–Diyl)"; Japanese Journel of Applied Physics, JP, Publication Office Japanese Journeal of Applied Physics. Tokyo; vol. 33, No. 2B, Part 02; Feb. 15, 1994; pp. L250–L253;XP000595019.

Bradley D D C et al; "Recent Progress In Polymers For Electroluminescence: Microcavity Devices And Electron Transport Polymers" Thin Solid Films, CH, Elsevier–Sequoia S.A. Lausanne; vol. 273, No. 1; Feb. 1, 1996; pp. 39–47; XP004017467.

Patent Abstract of Japan vol. 006, No. 214 (C–131); Oct. 27, 1982 & JP 57 119905A (RICOH KK), Jul. 26, 1982 Abstract.

*Primary Examiner*—Mark Kopec
(74) *Attorney, Agent, or Firm*—Nixon & Vanderhye P.C.

(57) ABSTRACT

This invention relates to an organic semiconductor device comprising a substrate bearing an organic layer sandwiched between electrode structures wherein the organic layer comprises a polymer of general Formula (I): wherein X is selected from H, CN, F, Cl, Br, $COOCH_3$. Y is given by the following general Formula (II): wherein A is a phenyl group which may be further substituted in 1 or 2 or 3 positions with groups independently selected from $C_{1-8}$ alkyl, CN, F, Cl; B and C are both phenyl groups which may be further substituted, independently of each other, in 1 or 2 or 3 or 4 or 5 positions with groups independently selected from $C_{1-8}$ alkyl, CN, F, Cl; A, B and C may also be, independently of each other, selected from pyrimidine, pyridazine and pyridine; m=5–20,000.

11 Claims, 5 Drawing Sheets

CONDUCTING POLYMERS

This invention concerns new compounds and the use of such compounds in organic compositions as electrically conducting and electronically active materials. In particular it relates to the use of sidechain polymer systems comprising covalently linked polymer chains bearing electrically active organic substitution.

It is recognised that a variety of organic compounds can be made to conduct electricity. The mechanism of electrical conduction may be either ionic conduction or electronic conduction. Ionic conduction is most important in blends of polymer materials with ionic compounds which may be regarded as solutes in the polymer. Movement of the ions under an applied electric field results in a flow of electric current. Typical materials in which ionic conductivity is important include blends of lithium salts in polymers such as poly(ethylene oxide).

Electronic conduction occurs in organic compounds even in the absence of addition of ionic salts. Various classes of organic compounds show this class of conduction, including conjugated polymers such as poly(acetylene), poly(phenylene vinylene) and poly(thiophene). This class of conduction is also found in molecular solids of low molecular mass such as N,N'-diphenyl-N,N'-ditolylbenzidine and aluminium tris 8-hydroxyquinolinate. Polymers which do not posses a conjugated main chain structure can also show electronic conductivity. Such polymers include poly(vinyl carbazole) as a known example.

Electronic conduction in these organic compounds relies on the insertion of electrical charge into the materials. Such electrical charge may be introduced in a variety of known ways, including doping with an oxidising or reducing agent, by chemical doping with a charge transfer reagent, or by direct insertion of positive or negative electric charge from a conducting electrode. Known examples of such introduction of charge include the chemical doping of poly(acetylene) with the oxidising agent iodine, doping of poly(vinyl carbazole) with the charge transfer reagent trinitrofluorenone, and the injection of charge into evaporated thin films of 3-biphenyl-5-(4-t-butylphenyl)oxadiazole from a low work function electrode such as a magnesium metal electrode by application of a negative potential to the electrode. This injection of charge may also be regarded as an electrochemical reduction of the conducting material, or as electrochemical doping of the material. Other electronically conducting organic compounds may be subjected to charge injection by a positive potential, which is commonly applied via an electrode composed of a high work function metal such as gold. Such charge injection is commonly described as injection of positive charges denoted holes, and this description is understood to be equivalent to the extraction of electrons from the conducting material. A further route to generation of charge in organic solids is the ionisation of molecules of the solid under the influence of an electric field or of incident light, or both. In this case, an electron is removed from a molecule of the material, and captured by another molecule, or by a different part of the molecule. In this way, a pair of separated positive and negative charges is produced, movement of either or both of which may contribute to conduction in the material.

Conduction within electronically conducting organic solids involves, in practical materials, the transfer of electrical charge from one molecule to another. Such transfer of charge is described by a charge hopping or charge tunnelling mechanism which may allow an electron to overcome the energetic barrier between different molecules or molecular sub-units. In systems such as conjugated polymers including poly(acetylene) and poly(phenylenevinylene) charge can also flow along the conjugated chain by movement of charged discontinuities in the regular bonding sequence of the polymer. In such cases, charge will normally be transferred through the bulk sample by a large number of individual molecules, and hopping or tunnelling remains an important mechanism.

The use of organic electrically conducting materials as semiconductors in the fabrication of electronic devices has been explored by many investigators. Field effect transistors have been fabricated from organic compounds such as poly(acetylene), pentacene, and poly(phenylenevinylene). Light emitting diodes have been demonstrated using a wide range of organic and molecular solids, including N,N'-diphenyl-N,N'-ditolylbenzidine, aluminium tris 8-hydroxyquinolinate, 3-biphenyl-5-(4-t-butylphenyl)oxadiazole and poly(phenylene vinylene). Preferably, such light emitting diodes are fabricated using at least two organic semiconductors which transport charge respectively by transport of holes and electrons. Such multilayer diodes attain higher efficiency than single layer devices, by trapping the charge carriers in the device until carrier recombination and light emission can take place. Photovoltaic devices have been fabricated using compounds such as copper phthalocyanine and perylene bisbenzimidazole. Photoconductive materials have been prepared and are recommended for use as sensitive layers in electrophotography, photocopying and printing applications. Such photoconductive compositions include compositions based on poly(vinylcarbazole) doped with trinitrofluorenone.

Conducting polymers may be used as components of optical storage and switching equipment by using the photorefractive effect. Photorefractive layers combine the capacity for photogeneration of charge, transport of charge carriers by diffusion or under an applied field and a linear electro-optic coefficient. Such properties may be obtained by addition of selected dopants to a conducting polymer. Suitable dopants for inducing the capability for photogeneration of charge include $C_{60}$ fullerene. Suitable dopants to provide a linear electro-optic coefficient include dimethylamino nitrostilbene.

Many shortcomings have been identified in organic conducting materials described in the prior art. Among these shortcomings, chemical stability is an important parameter. Poly(acetylene), which shows a high electrical conductivity in the doped state, is converted to a non-conducting product on exposure to air, and must be handled and used in an inert atmosphere. Poly(phenylenevinylene) is believed to undergo oxidation of the conjugated double bonds in the main chain, yielding non-luminescent oxidation products. Further degradation mechanisms have been identified or proposed for poly(phenylenevinylene) when it is incorporated in devices, including sensitivity to ambient ultraviolet radiation. Molecular solids such as N,N'-diphenyl-N,N'-ditolylbenzidine may undergo crystallisation, changes in morphology, or melting in operating devices. These effects may cause premature failure or loss in efficiency of the device.

A further important shortcoming which is common in many organic conducting materials rests in the difficulty and high cost of processing the materials. Both poly(acetylene) and poly(phenylenevinylene) are insoluble and infusible materials which are prepared for use in devices by use of a precursor polymer route. Typically a soluble precursor polymer is first synthesised and deposited onto a prepared substrate. A combination of heat and vacuum is then used to chemically convert the precursor polymer into the target product, usually with elimination of smaller volatile molecules of one or more by-products. Processing of the target polymer to a dense film in bulk quantities requires critical control of this step which moreover entails the use of costly and time consuming vacuum processing stages. The final polymer is difficult to further process, and steps such as patterning and lithography are difficult to accomplish. Many attempts have been made to provide solution processable organic conductors. Substitution of alkyl, alkoxy and other flexible organic radical onto the polymers is understood to improve their solubility and processibility. Such substitution, however, may also commonly reduce the mobility of charges in the system, making the product less desirable for device preparation. Said substitution may also change the orbital energies of the system, altering the potential required for charge injection into the material.

Low molecular mass conducting organic materials must be deposited in thin uniform films for use in devices. Such films are commonly deposited by vacuum deposition onto the substrate from an electrically heated boat. This process is relatively time consuming and requires the use of costly high vacuum handling equipment. The time required for use of such equipment is relatively long due to the need for evacuation and outgassing of the materials and equipment at different stages in the process. Therefore this route does not provide means for low cost fabrication of organic semiconductor devices.

Quinoxalenes including some polyquinoxalenes are discussed in the following references:

Die Makromolekulare Chemie 127 (1969) 264–70 (no. 3142);

Die Makromolekulare Chemie 171 (1973) 49–55;

Die Makromolekulare Chemie 176 (1975) 593–607.

It has now been unexpectedly found that processable conducting organic polymers may be prepared by polymerisation of vinyl substituted quinoxaline derivatives. It is further found that the charge mobility in such polymers is high and organic semiconductor devices fabricated from them provide excellent performance. Test devices show no sign of crystallisation of the quinoxaline polymer. Furthermore the polymers unexpectedly show excellent solubility in common solvents and may be processed into uniform films suitable for device fabrication simply by spin coating from solution. Said polymers therefore satisfy the requirements for fabrication of organic semiconductor devices in large areas by inexpensive and rapid processing methods.

According to this invention an organic semiconductor device comprises a substrate bearing an organic layer sandwiched between electrode structures wherein the organic layer comprises a polymer of general Formula I:

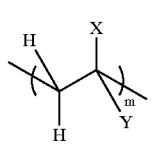

Formula I wherein X is selected from H, CN, F, Cl, Br, $COOCH_3$

Y is given by the following general Formula II:

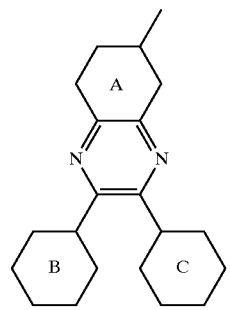

Formula II wherein A is a phenyl group which may be further substituted in 1 or 2 or 3 positions with groups independently selected from $C_{1-8}$ alkyl, CN, F, Cl;

B and C are both phenyl groups which may be further substituted, independently of each other, in 1 or 2 or 3 or 4 or 5 positions with groups independently selected from $C_{1-8}$ alkyl, CN, F, Cl;

A, B and C may also be, independently of each other, selected from pyrimidine, pyridazine and pyridine;

m=5–20,000.

Preferably A B C are phenyl

Preferably m=50–500.

It may also be the case that the organic layer further comprises another or a plurality of other organic semiconductor materials, including Hole Transport materials.

The organic layer may comprise a polymer blend which comprises a polymer of general Formula I.

The organic layer may further comprise a light emitter which may also be referred to as a luminescent material.

The organic layer may, in so far as the light emitting, hole transporting and electron transporting functionalities are concerned be 1 or 2 or 3 layers.

Preferably the light emitter is given by any of the following:

A luminescent dye of the coumarin type with a quantum efficiency of photoluminescence of 0.6 or greater A boron difluoride/pyromethene dye of the general type described by L R Morgan and J H Boyer in U.S. Pat. No. 5,446,157

A luminescent condensed aromatic hydrocarbon such as coronene, rubrene, diphenyl anthracene, decacyclene, fluorene, perylene etc., and luminescent derivatives of such compounds including esters and imides of perylene, cyanated fluorene derivatives etc.

A luminescent chelate of a metal including europium, samarium, terbium, ruthenium chelates.

Preferably the organic semiconductor device is an organic light emitting diode device.

Preferably at least one of the electrodes is transparent to light of the emission wavelength of the organic layer. The other electrode may be a metal, for example Sm, Mg, Li, Ag, Ca, Al or an alloy of metals, for example MgAg, LiAl or a double metal layer, for example Li and Al or Indium Tin Oxide (ITO). One or both electrodes may consist of organic conducting layers.

Further objectives of the device include one or more of the following: higher brightness, higher efficiency, purer spectral colours, long operating life.

The structural and other preferences are expressed on the basis of desirable charge transport characteristics, in particular an advantageous combination of electronic work function which is one factor determining the electric potential required to inject charge in to the polymer from a metallic or semiconducting electrode, charge carrier mobility, resistance to injection and transport of minority charge carriers, i.e. of positive charges ease of synthesis from readily available and inexpensive starting materials, solubility, film forming ability and high physical and chemical stability of deposited films of the polymer in storage and in operating devices.

Preferably the polymers are HOMO-polymers.

Overall preferred structures for Formula I are those listed below:

Poly(vinyl diphenyl quinoxaline)

Poly(vinyl dipyridyl quinoxaline)

Poly(diphenyl quinoxalinyl acrylonitrile)

Poly(vinyl di-4-fluorophenyl quinoxaline).

Compounds of Formula I can be prepared by various routes. Typically the polymers are formed by polymerisation of a 6-VINYL-2,3-DIPHENYLQUINOXALINE which may in turn be prepared by reaction of a 6-chloro-2,3-diphenylquinoxaline with tributylvinyl tin. Either or both of these starting materials may bear appropriate substitution which is incorporated in the product 6-VINYL-2,3-DIPHENYLQUINOXALINE.

An advantageous approach to the synthesis of 6-VINYL-2,3-DIPHENYLQUINOXALINE monomers uses the Wittig reaction between formaldehyde and 2,3-diphenylquinoxaline-6-methyl triphenyl phosphonium bromide.

Other approaches to the synthesis of 6-VINYL-2,3-DIPHENYLQUINOXALINE will be evident to those skilled in the art, and may be used with advantage according to the particular nature and pattern of substitution which is desired.

Polymerisation of the 6-VINYL-2,3-DIPHENYLQUINOXALINE monomer to form the polymer of Formula 1 may be accomplished by known means of ionic e.g. anionic or free radical polymerisation.

Preferably the polymerisation is carried out in solution in an organic solvent under conditions of anionic or free radical polymerisation.

According to a further aspect of this invention mixtures or so-called polymer blends suitable for use in the devices of the present invention may be formulated comprising the polymers of general Formula I.

Other polymers which may be incorporated into the blend include:

Poly(vinyl carbazole)

Poly(4-vinyl triphenylamine)

Poly(N,N-di-4-dimethylaminophenyl 4-vinylaniline)

Poly(N-phenyl N-4-methoxyphenyl 4-vinylaniline)

Poly(N-phenyl N-4-dimethylaminophenyl 4-vinylaniline)

Poly(N-4-methylphenyl N-4dimethylaminophenyl 4-vinylaniline)

Poly(N-phenyl N-4-diphenylaminophenyl 4-vinylaniline)

Poly(N,N-di-4-diphenylaminophenyl 4-vinylaniline)

Poly(N,N,N"-triphenyl N'-4-styryl benzidine)

Poly(N-phenyl N,N'-di-3-methylphenyl N'-4-styryl benzidine)

Poly(N-phenyl N,N'-1-naphthyl N'-4-styryl benzidine).

The polymer blend may also comprise a separate light emitting material. Though it may also be the case that one of the polymers in the polymer blend provides the function of the light emitter.

A further aspect of this invention is the use of compounds of general formula I as organic conducting polymers.

The invention will now be described with reference to the following diagrams by way of example only:

Figure 4:
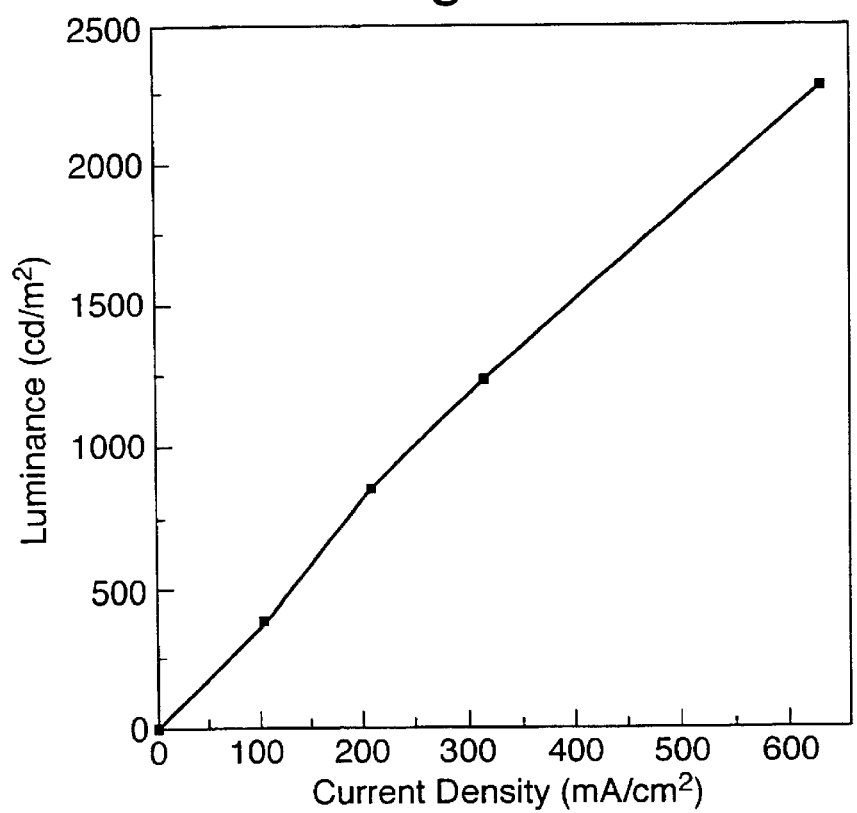

FIG. 4 shows Luminance versus current density for single layer device comprising 0.5% PM580 99.5% RJP5R all 4.5% solution in dichlorobenzene. Film thickness 76 nm.

Figure 5:
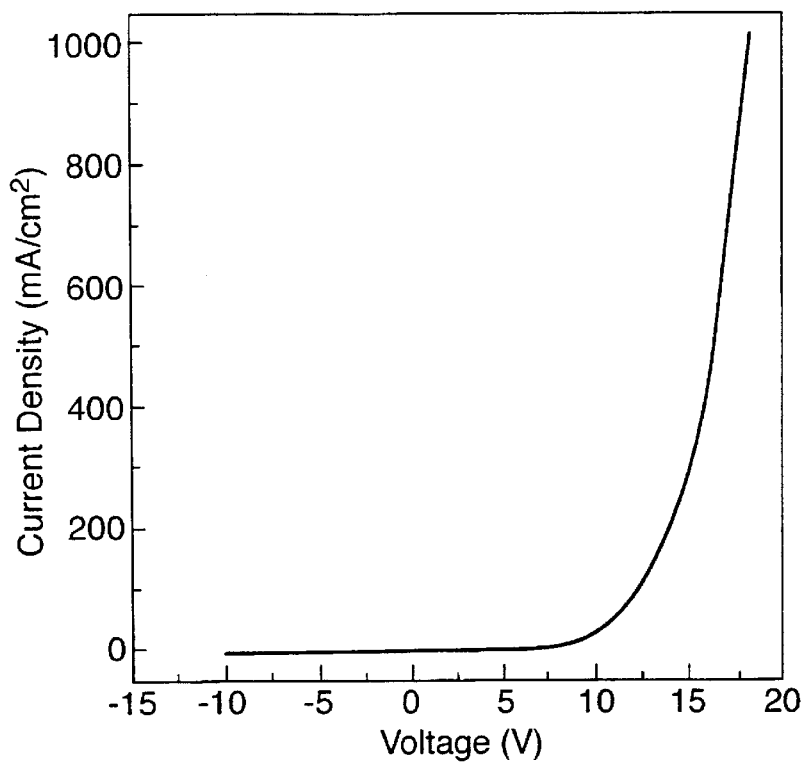

FIG. 5: Variation of current density with voltage for sample described in FIG. 4.

Figure 6:
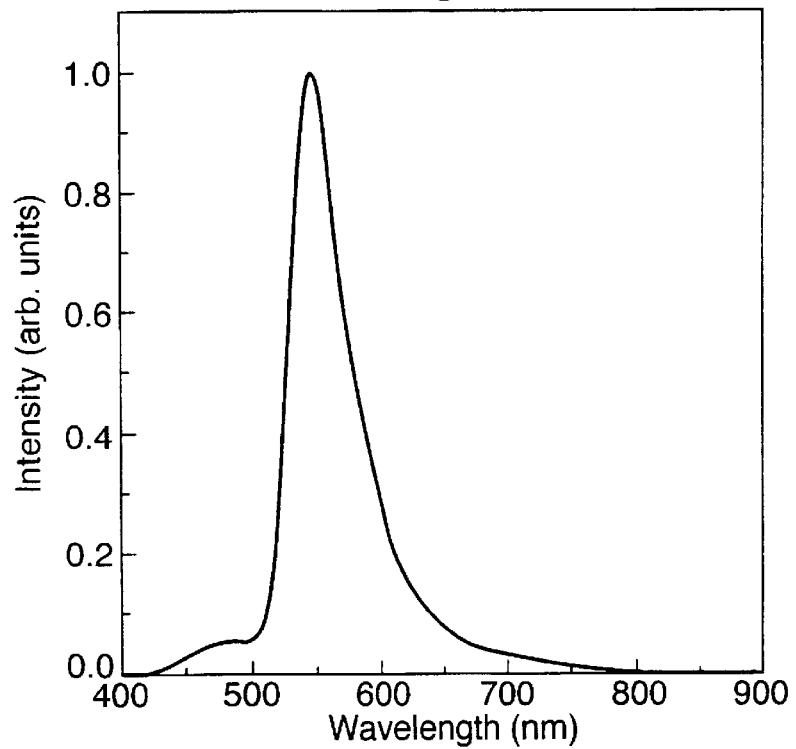

FIG. 6: Emission Spectrum for sample described in FIG. 4.

Figure 7:
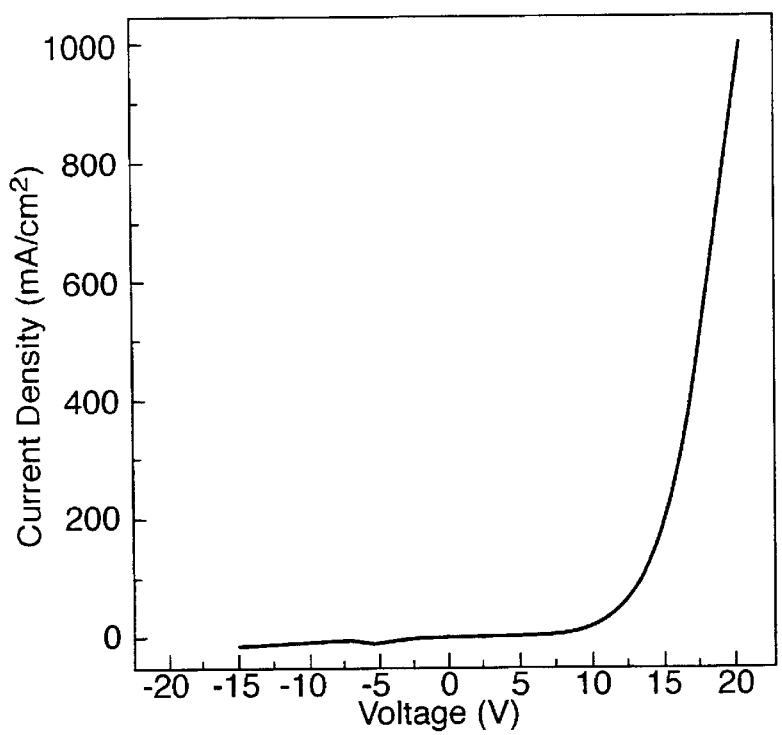

FIG. 7: Variation of current density with voltage for single-layer device comprising 0.5% PM650: 99.5% RJP5R all 4.5% solution in dichlorobenzene. Organic film thickness 70 nm.

Figure 8:
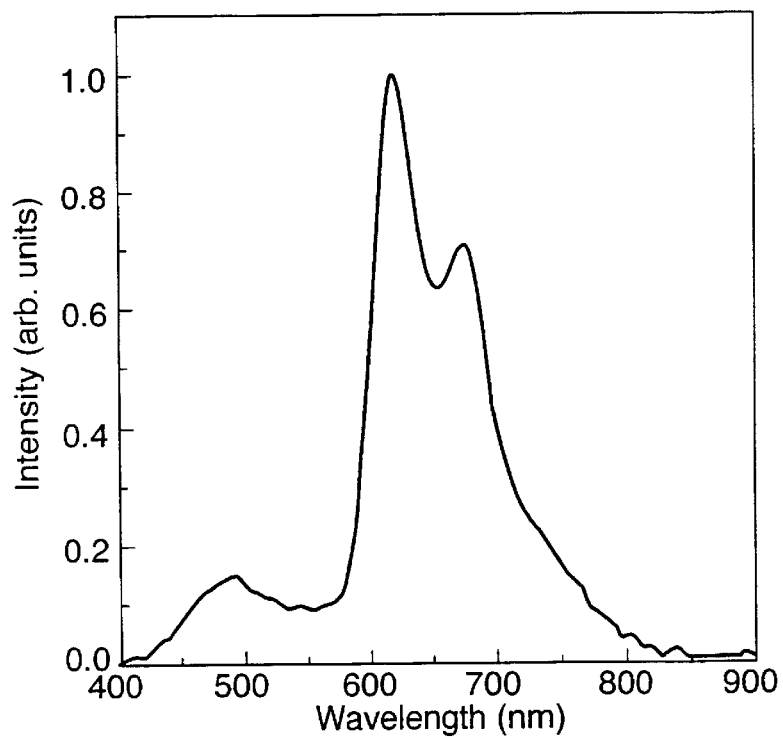

FIG. 8: Emission Spectrum for sample described in FIG. 7.

Figure 9:
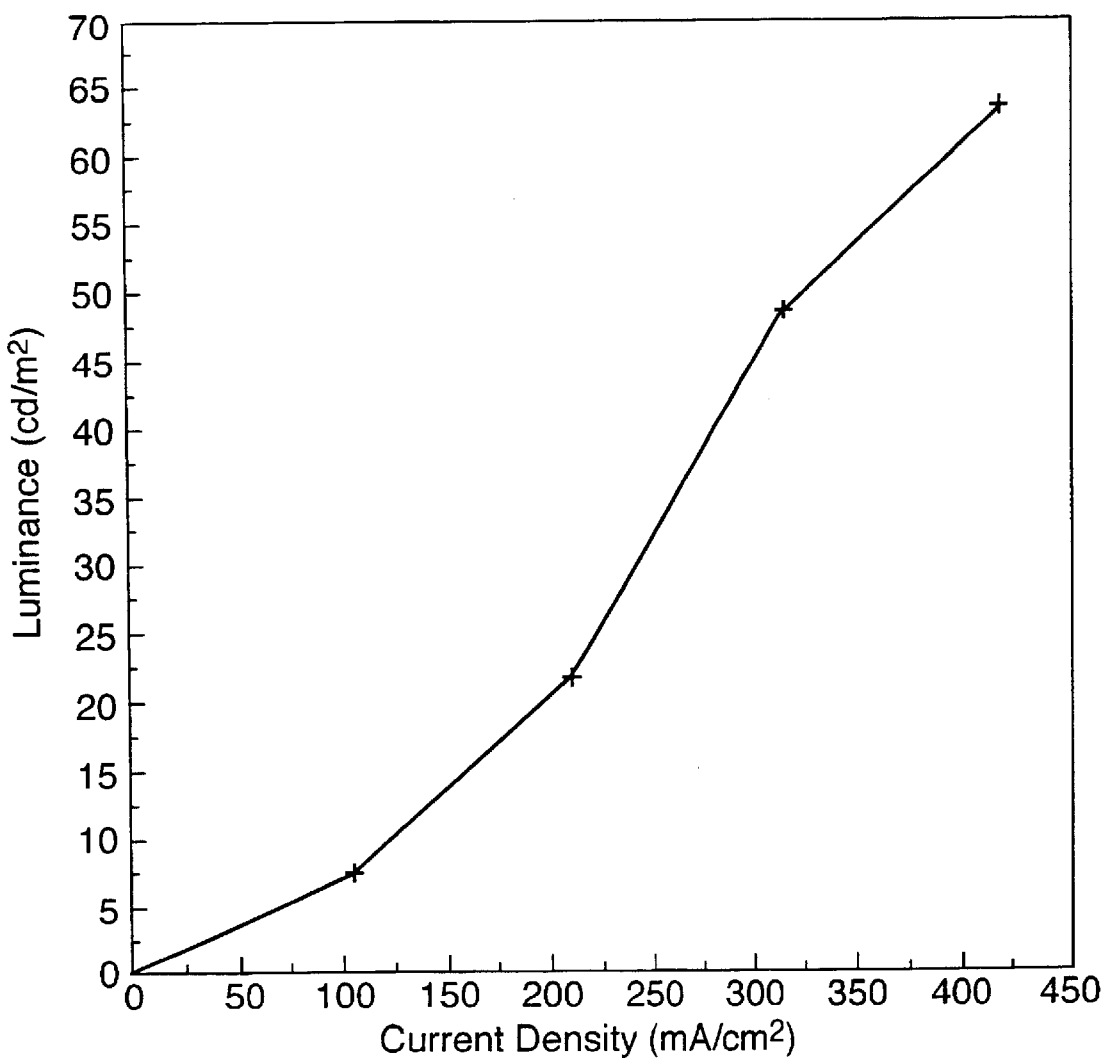

FIG. 9: Luminance versus current density for sample described in FIG. 7.

Data from FIGS. 5 and 7 was obtained using a computer controlled Keithley 236 Source Measure Unit.

Data from FIGS. 4,6,8,9 was obtained using the Keithley 236 Source Measure Unit to fix the current through the device whilst measuring the emission intensity and/or emission spectrum using the Photoresearch PR714 fast spectral scanning SpectraRadiometer.

Unless otherwise stated all reagents used are commercially available from the Aldrich Chemical Company.

Emitters PM650 and PM580 were obtained from AG Electro-Optics, Farside House, Tarporley Business Centre, Tarporley, Cheshire.

The following compounds are examples that have been synthesised according to the present invention for use in polymer blends and devices:

EXAMPLE 1

Synthesis of 6-Vinyl-2,3-diphenylquinoxaline

Synthesis of 6-Methyl-2,3-diphenylquinoxaline 1,2-Diamino-4-methylbenzene (25.0 g, 0.20 mol) and benzil (43 g, 0.20 mol) were refluxed in ethanoic acid (250 ml) overnight. The solvent was evaporated in vacua and the black residue recrystallised three times from ethanol to give pale brown crystals of 6-methyl-2,3-diphenylquinoxaline, 39.6 g, 65% (m.pt. 114.5–116° C. (lit.[i] 115–116° C.)). $^1$H NMR (CDCl$_3$, 300 MHz) δ 8.08 (d, J 8.4 Hz, 1H, Hs of quinoxaline), 7.97 (bs, 1H, Hs of quinoxaline), 7.60 (d of d, J 8.4 Hz, J 1.8 Hz, 1H, Hs of quinoxaline), 7.50–7.58 (m, 4H, phenyl rings), 7.30–7.38 (m, 6H, phenyl rings), 2.62 (s, 3H, CH$_3$).

[i] Braun, Quarg, *Angew. Makromol. Chem.*, 1975, 43, 125

Synthesis of 6-Bromomethyl-2,3-diphenylquinoxaline

6-Methyl-2,3-diphenylquinoxaline (5.0 g, 16.9 mmol) was dissolved in dry, oxygen free benzene (50 ml). The solution was brought to reflux and a mixture of NBS (3.00 g, 16.9 mmol) and AIBN (0.1 g) added as a solid over a period of 30 minutes. The solution was then refluxed for 2 hrs, cooled, washed with water (3×100 ml), dried over MgSO$_4$ and evaporated to leave a pale brown solid. This was recrystallised from hexane/toluene (1:1, 80 ml) to yield 6-bromomethyl-2,3-diphenylquinoxaline, 3.5 g, 56%. Traces of 6-methyl-2,3-diphenylquinoxaline were shown to be present by $^1$H NMR. A small sample was recrystallised from acetone for characterisation (m.pt. 146–148° C.). Found: C,; H,; N, %; $C_{21}H_{15}N_2Br$ requires C, 67.21; H, 4.03; N, 7.47%. $^1$H NMR (CDCl$_3$, 300 MHz) δ 8.16 (d, J 8.7 Hz, 1H, Hs of quinoxaline), 8.16 (d, J 2.2 Hz, 1H, Hs of quinoxaline), 7.78 (d of d, J 8.7 Hz, J 2.2 Hz, 1H, Hs of quinoxaline), 7.48–7.56 (m, 4H, phenyl ring), 7.30–7.40 (m, 6H, phenyl ring), 4.71 (s, 2H, CH$_2$Br).

Synthesis of Triphenyl(diphenylquinoxaline)phosphonium Bromide

6-Bromomethyl-2,3-diphenylquinoxaline (1.0 g, 2.7 mmol) and triphenylphosphine (0.70 g, 2.7 mmol) were dissolved in toluene (50 ml) and the solution refluxed overnight. The white solid that precipitated was recovered by filtration and dried in vacuo to give triphenyl (diphenylquinoxaline)phosphonium bromide (1.58 g, 93%). $^1$H NMR (CDCl$_3$, 300 MHz) δ 7.1–7.8 (m, 29H, aromatic Hs), 5.82 (d, $^2J_{HP}$ 13 Hz, 2H, CH$_2$P). Found: C,; H,; N, %; $C_{39}H_{30}N_2PBr$ requires C, 73.47; H, 4.74; N, 4.39%. Melting point: decomposes around 200° C.

Synthesis of 6-Vinyl-2,3-diphenylquinoxaline

Triphenyl(diphenylquinoxaline)phosphonium bromide (44.0 g, 69 mmol) was dissolved in dichloromethane (100 ml) and formaldehyde (10 ml, 37% solution in water, 118 mmol) added. Aqueous sodium hydroxide (50 ml, 50% solution) was added dropwise of a period of 30 minutes with rapid stirring and stirred for a further 30 minutes. The solution was diluted with dichloromethane, washed with water, dried over MgSO$_4$ and evaporated to dryness to give a pale yellow solid. This solid was purified by column chromatography on silica with hexane as the eluent to give white crystals, 10.5 g, 50% (m.pt. 122–123° C., lit.[ii] 122–123° C.). Found: C,; H,; N, %; $C_{22}H_{16}N_2$ requires C, 85.69; H, 5.23; N, 9.08%. $^1$H NMR (CDCl$_3$, 300 MHz) δ 8.11 (d, $^3J_{HH}$ 8.7 Hz, 1H, quinoxaline H), 8.10 (br, 1H, quinoxaline H), 7.90 (d of d, $^3J_{HH}$ 8.7 Hz, $^4J_{HH}$ 2.1 Hz, quinoxaline H), 7.45–7.55 (m, 4H, phenyl H), 7.28–7.38 (m, 6H, phenyl H), 6.95 (d of d, $^3J_{HH}$(cis) 11.1 Hz, $^3J_{HH}$(trans) 17.7 Hz, 1H, vinylic H), 6.00 (d, $^3J_{HH}$(trans) 17.7 Hz, 1H, vinylic H), 5.47 (d, $^3J_{HH}$(CIS) 11.1 Hz 1H, vinylic H).

[ii] G. Manecke, U. Rotter, Makromol. Chem., 171, 1973, 49

The following compounds are obtained analogously:

vinyl diphenyl quinoxaline vinyl dipyridyl quinoxaline vinyl di-4-fluorophenyl quinoxaline.

Polymerisation of 6-Vinyl-2,3-diphenylquinoxaline

The polymerisation was carried out using 6-vinyl-2,3-diphenylquinoxaline (0.54 g, 1.75 mmol) and $^s$BuLi (40.5 μl, 1.3M in cyclohexane) in THF (10 ml) at −78° C. The solution became dark red upon injection of the initiator into the vessel and remained so until termination of the polymerisation by the addition of a small quantity of degassed methanol. Pouring the solution into methanol precipitated the polymer which was collected by filtration and dried in vacuo to yield a white powder (0.45 g). GPC analysis (CHCl$_3$, polystyrene equivalents): $\overline{M}_n$ 11,700, $\overline{M}_w$ 16,100, $\overline{M}_w/\overline{M}_n$ 1.38

The following compounds are obtained analogously:

Poly(vinyl diphenyl quinoxaline)

Poly(vinyl dipyridyl quinoxaline)

Poly(diphenyl quinoxalinyl acrylonitrile)

Poly(vinyl di-4-fluorophenyl quinoxaline).

Preparation of Polymer Blend of RJP5R Which is a 1:1 Mixture (or Blend) of Poly(4-vinyltriphenylamine) (PVTPA) and Polyvinyl-2,3-diphenylquinoxaline (PVDPQO)

Polyvinyl-2,3-diphenylquinoxaline (0.40 g) and poly(4-vinyltriphenylamine) (0.40 g RJP4U) were dissolved in 10 ml of dichloromethane, stirred overnight, filtered through a 0.2 μm filter into methanol (100 ml). The polymer which precipitated was collected by filtration and dried under vacuum to yield 0.70 g of a white powder.

PVTPA may be prepared by literature methods—for example by the method revealed in Compton R G, Laing M E, Ledwith A, Abuabdoun I I J. Appl. Electrochem., 1988, 18, 431

Similarly blends comprising PVDPQO and the following polymers are made:

Poly(vinyl carbazole)

Poly(4-vinyl triphenylamine)

Poly(N,N-di-4-dimethylaminophenyl 4-vinylaniline)

Poly(N-phenyl N-4-methoxyphenyl 4-vinylaniline)

Poly(N-phenyl N-4-dimethylaminophenyl 4-vinylaniline)

Poly(N-4-methylphenyl N-4-dimethylaminophenyl 4-vinylaniline)

Poly(N-phenyl N-4-diphenylaminophenyl 4-vinylaniline)

Poly(N,N-di-4-diphenylaminophenyl 4-vinylaniline)

Poly(N,N,N'-triphenyl N'-4-styryl benzidine)

Poly(N-phenyl N,N'-di-3-methylphenyl N'-4-styryl benzidine)

Poly(N-phenyl N,N'-1-naphthyl N'-4-styryl benzidine.

Figure 1:
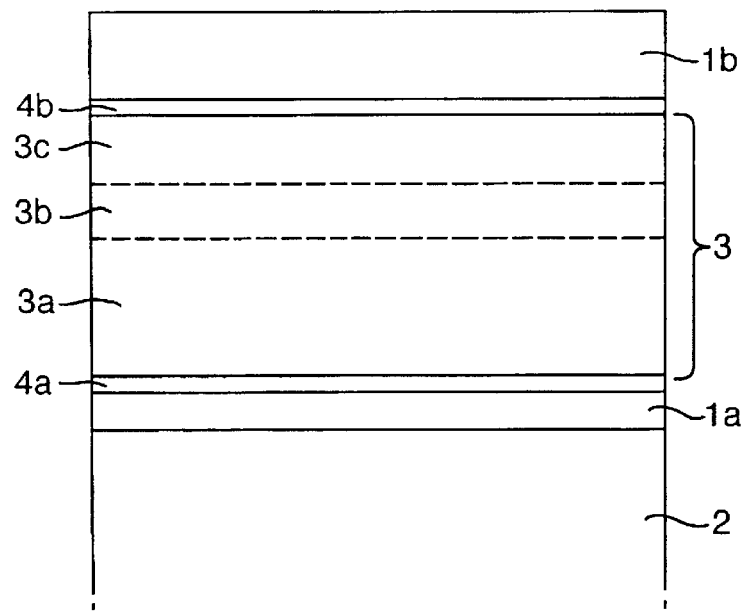
FIG. 1 illustrates an Organic Light Emitting Diode (OLED) device incorporating the materials of the present invention.

By way of example, an Organic Light Emitting Diode (OLED), which is a type of semiconductor device, suitable for incorporating materials/blends of the present invention is illustrated in FIG. 1. The device comprises two electrodes 1a, 1b, at least one of the electrodes is transparent to light of the emission wavelength of a layer of organic material 3. The other electrode may be a metal, for example Sm, Mg, Li, Ca, Al or an alloy of metals, for example MgAg, LiAl or a double metal layer, for example Li and Al or Indium Tin Oxide (ITO). One or both electrodes 1a, 1b may consist of organic conducting layers. A processing surface or substrate 2 may be made of any material which is flat enough to allow subsequent processing, for example glass, silicon, plastic. The substrate 2 may be transparent to the emitted radiation of the organic material 3. Alternatively one of the electrodes 1a, 1b may be transparent instead. Sandwiched between the electrodes 1a and 1b is a layer of organic material 3 which may itself consist of one or more layers represented here as 3a, 3b, 3c. The layer of organic material 3 possesses the following three properties: electron transporting (ET); hole transporting (HT); light emitting (LE). The materials described by the current invention are suitable for use as electron transporters. If the layer of organic material 3 is a single layer then the single layer of organic material 3 must exhibit all three properties. For the case when the layer of organic material 3 is a single layer then the organic material may consist of a single material, for example it is known to use polyphenylenevinylene, or by mixing two or more materials with appropriate properties together, for example it is known to combine N,N'-diphenyl-N,N'-ditolylbenzidine (HT), Coumarin 6 Laser dye (LE) and t-Butylphenyl 4-biphenylyl-oxadiazole (ET) which may be abbreviated to PBT. For the case when the layer of organic material 3 comprises more than one layer then suitable examples include:

i/ 3a=HT layer, 3b=LE layer, 3c=ET layer ii/ 3a=HT layer, 3b=material which acts as an ET medium but also emits light, for example Aluminium tris 8-hydroxyquinolinate (Alq3)

iii/ 3a=HT and LE, 3b=ET iv/ The LE material may be doped in small quantities—typically 0.5% into ET or HT or both. Typical doping agents are coumarin 6 or pentaphenyl cyclopentadiene. In the case of i/ above there may be present a hole injection layer sandwiched between the HT layer and an electrode and there may also be present an electron injection layer sandwiched between the ET layer and an electrode.

Preferably in the case where the layer of organic material 3 is a multiplicity of layers, then the layer adjacent to the cathode preferentially transports electrons and/or the layer adjacent the anode preferentially transports holes. Preferably the luminescent material has a high quantum efficiency of luminescence. The luminescent component may be combined with a charge transporting material or may be present in a separate layer.

The layer of organic material 3 may be deposited on the electrode 1a by any of the following techniques: thermal evaporation under vacuum, sputtering, chemical vapour deposition, spin depositing from solution or other conventional thin film technology. The thickness of the layer of organic material 3 is typically 30–2000 nm, preferably 50–500 nm.

Figure 2:
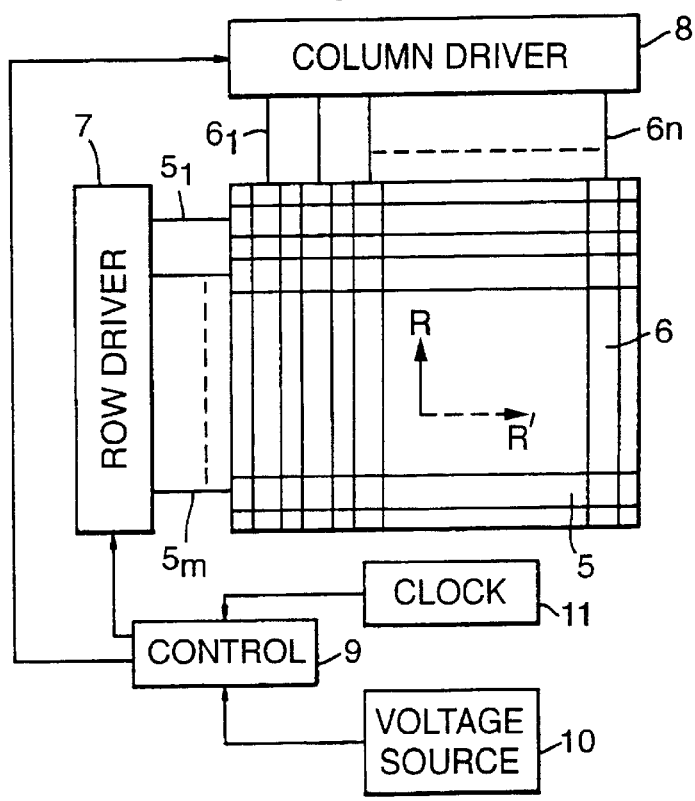
FIG. 2 is a plan view of a matrix multiplex addressed device of FIG. 1.

The device may contain layers 4a and 4b which are situated next to the electrodes 1a and 1b these layers 4a and 4b may be conducting or insulating and act as a barrier to diffusion of the electrode material or as a barrier to chemical reaction at the electrode 1a, 1b and layer of organic material 3 interface. Examples of suitable materials for 4a and 4b include emeraldine which prevents indium diffusion into the layer of organic material 3 from an ITO electrode, or, for the same reason, copper phthalocyanine may be used; alternatively the addition of a thin layer (~0.5 nm) of lithium or magnesium fluoride at the interface between a lithium electrode and the layer of organic material 3 may be used. The device of FIG. 1 may be a singe pixel device or it may be matrix addressed. An example of a matrix addressed OLED is shown in plan view in FIG. 2. The display of FIG. 2 has the internal structure described in FIG. 1 but the substrate electrode 5 is split into strip-like rows 5l to 5m and similar column electrodes 6l to 6n, this forms an m×n matrix of addressable elements or pixels. Each pixel is formed by the intersection of a row and column electrode.

A row driver 7 supplies voltage to each row electrode 5. Similarly, a column driver 8 supplies voltage to each column electrode. Control of applied voltages is from a control logic 9 which receives power from a voltage source 10 and timing from a clock 11.

The following illustrates a method of device fabrication incorporating the material prepared in Example 1.

EXAMPLE

Device Fabrication 4.5% by weight of a mixture of the polymer (99.5%) produced by the blend of polyvinyl triphenylamine and polyvinyldiphenylquinoxaline in combination with emitter PM580 (0.5%) was dissolved in dichlorobenzene. The solution was deposited on to an indium tin oxide coated glass substrate which was then spun at 300 rpm for 30 s. The substrate was removed from the spinner and placed on a hotplate at 75° C. for 10 mins to drive off the residual solvent. A uniform polymer film was deposited by this means. On to the uniform polymer layer, a cathode comprising 100 nm layer of magnesium and a 100 nm silver was deposited by thermal evaporation. The film thickness obtained was ~76 nm. The layer of silver cathode may be deposited by thermal evaporation under high vacuum through an evaporation mask. The mask was patterned with a series of 3.5 mm diameter circular holes, resulting in an array of circular electrode pads deposited on the organic layers. The sample was removed from the vacuum chamber and electrical connections were made using indium solder to contact to the ITO and a cooper wire to contact the silver pads. Each device defined by the area of metallisation of one silver pad was found to function both as a rectifier and as a light emitting diode.

A further example includes:

(0.5% PM650 99.5% RJP5R) all 4.5% in dichlorobenzene. Organic film thickness 70 nm.

Poly(phenylenevinylene) layers were deposited by the tetrahydrothiophene precursor route, as described by Wessling and Zimmerman in U.S. Pat. No. 3,401,152. The precursor polymer was spun from solution in methanol onto indium tin oxide glass substrates. Conversion of the precursor to PPV was achieved by heating in vacuum at 210° C. for 10 hours. For the two layer devices, sidechain electron transport polymers were deposited by spin coating from solution in dichlorobenzene as in the example above, and the same steps followed to deposit a metal cathode layer.

Figure 3:
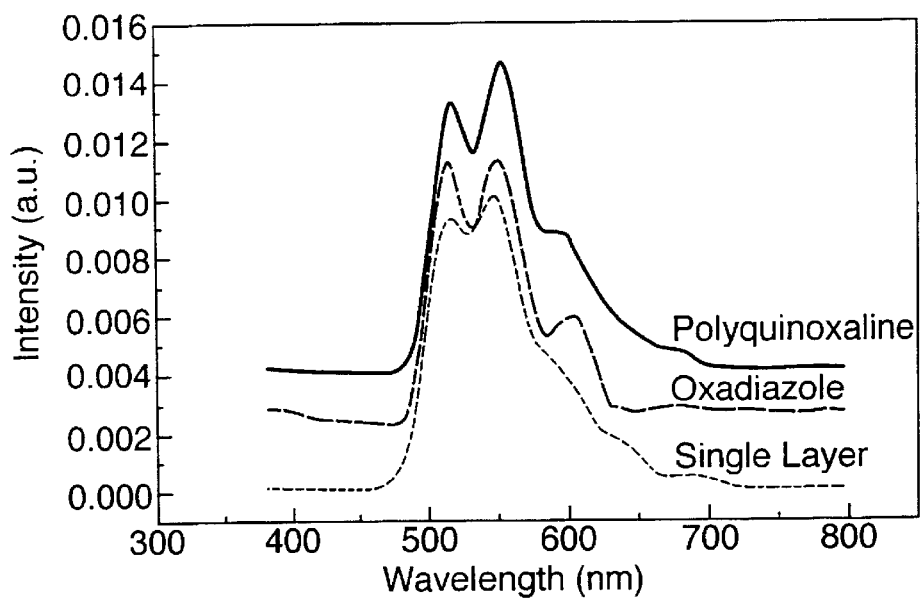
FIG. 3 illustrates intensity versus wavelength for a polyquinoxaline of the present invention and compares with PPV and oxadiazole polymer/PPV systems.

Data for polyquinoxaline when compared with known systems as shown in FIG. 3 is set out below for the following three structures:

| | | |
|---|---|---|
| Silver | Silver | Silver |
| Magnesium | Magnesium | Magnesium |
| PPV (35 nm) | Oxadiazole (20 nm) | Polyquinoxaline (25 nm) |
| ITO | PPV (35 nm) | PPV (35 nm) |
| Glass | ITO | ITO |
| | Glass | Glass |

PPV = polyphenylvinylene which provides the functions of LE HT and ET.

The oxadiazole is present for comparative purposes only.

| ETP | Max Q.E. (Cd/A) | Mean Q.E. (Cd/A) | Max Q.E (%) | Mean Q.E. (%) | Max P.E. (lm/W) | Mean P.E. (lm/W) |
|---|---|---|---|---|---|---|
| Polyquinoxaline | 0.01374 | 0.00804 | 0.00413 | 0.00242 | 0.00654 | 0.00315 |
| Oxadiazole | 0.00799 | 0.00380 | 0.00240 | 0.00114 | 0.00282 | 0.00132 |
| None | 0.00102 | 0.00070 | 0.00031 | 0.00021 | 0.00033 | 0.00070 |

Wherein ETP is the electron transporting polymer
Q.E. = Quantum Efficiency
P.E. = Power Efficiency The bilayer device using a polyquinoxaline electron-transporting polymer exhibits a peak external quantum efficiency improvement of a factor 13.3 over a single layer device and a factor 1.7 over a bilayer device using the prior art oxadiazole based polymer. The average quantum efficiency of the device using polyquinoxaline is a factor 11.5 higher than a single layer device and a factor 2.1 higher than the bilayer device using oxadiazole. The oxadiazole device has a peak external quantum efficiency a factor 7.7 higher than the single layer device and the average quantum efficiency is a factor 5.4 higher than a single layer device. The emission spectrum is substantially unaffected by the inclusion of the electron transport layer as shown in FIG. 3.

The compounds of formula I may also be used in photosensitive devices for example photodiodes, photovoltaic cells, sensitive layers for electrophotography and photorefractive layers.

In the case where the conducting polymers of the current invention may be used as components of optical storage and switching equipment by use of the photorefractive effect then with reference to FIG. 1, the layer 3 comprises a layer of organic material having conductive, photogenerative and electro-optic properties. Such properties may be obtained by addition of suitable dopants to a conducting polymer as described by the present invention. Suitable dopants for inducing the capability for photogeneration of charge include $C_{60}$ fullerene. Suitable dopants to provide a linear electro-optic coefficient include dimethylamino nitrostilbene.

What is claimed is:

1. An organic conducting polymer given by general formula (I):

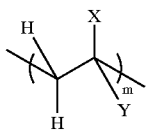

Formula I wherein X is selected from H, CN, F, Cl, Br, $COOCH_3$
Y is given by the following general Formula II:

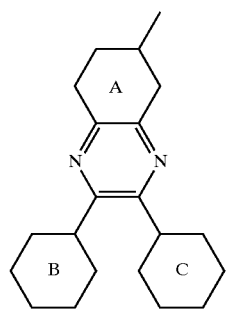

Formula II wherein A is a phenyl group which may be further substituted in 1 or 2 or 3 positions with groups independently selected from $C_{1-8}$ alkyl, CN, F, Cl;
B and C are both phenyl groups which may be further substituted, independently of each other, in 1 or 2 or 3 or 4 or 5 positions with groups independently selected from $C_{1-8}$ alkyl,
CN, F, Cl;
A, B and C may also be, independently of each other, selected from pyrimidine, pyridazine and pyridine;
m=5–20,000.

2. A polymer blend suitable for use in an organic semiconductor device comprising a substrate bearing an organic layer sandwiched between electrode structures wherein the polymer blend comprises a polymer of general formula I of claim 1.

3. A photorefractive device comprising a substrate bearing an organic layer sandwiched between electrode structures wherein the organic layer comprises a polymer blend of claim 2.

4. An organic semiconductor device comprising a substrate bearing an organic layer sandwiched between electrode structures wherein the organic layer comprises a polymer blend according to claim 2.

5. An organic semiconductor device comprising a substrate bearing an organic layer sandwiched between electrode structures wherein the organic layer comprises a polymer given by general Formula I:

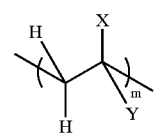

Formula I wherein X is selected from H, CN, F, Cl, Br, $COOCH_3$
Y is given by the following general Formula II:

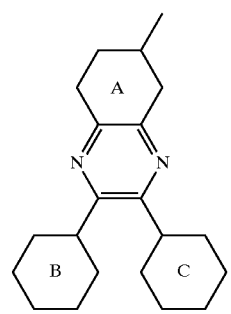

Formula II wherein A is a phenyl group which may be further substituted in 1 or 2 or 3 positions with groups independently selected from $C_{1-8}$ alkyl, CN, F, Cl;
B and C are both phenyl groups which may be further substituted, independently of each other, in 1 or 2 or 3 or 4 or 5 positions with groups independently selected from $C_{1-8}$ alkyl,
CN, F, Cl;
A, B and C may also be, independently of each other, selected from pyrimidine, pyridazine and pyridine;
m=5–20,000.

6. A device according to claim 5 wherein A B C are phenyl and m=50–500.

7. A device according to claim 5 wherein the polymer is given by any of the following:
Poly(vinyl diphenyl quinoxaline)
Poly(vinyl dipyridyl quinoxaline)
Poly(diphenyl quinoxalinyl acrylonitrile)
Poly(vinyl di-4-fluorophenyl quinoxaline).

8. A device according to claim 5 wherein the organic layer further comprises a light emitter.

9. A device according to claim 8 wherein the light emitter is given by any of the following:
a luminescent dye of the coumarin type with a quantum efficiency of photoluminescence of 0.6 or greater,
a boron difluoride/pyromethene dye, a luminescent condensed aromatic hydrocarbon including coronene, rubrene, diphenyl anthracene, decacyclene, fluorene, peryiene, a luminescent chelate of a metal including europium, samarium, terbium, ruthenium chelates.

10. A device according to claim 5 wherein at least one of the electrodes is transparent to light of the emission wavelength of the organic layer and the other electrode is a metal, including Sm, Mg, Li, Ag, Ca, Al or an alloy of metals including MgAg, LiAl or double metal layer including Li and Al or Indium Tin Oxide (ITO).

11. A photorefractive device comprising a substrate bearing an organic layer sandwiched between electrode structures wherein the organic layer comprises a polymer of general formula I of claim 5.

* * * * *

Disclaimer

6,716,371 — Ian C. Sage, Worcester (GB); Emma L. Wood, Worcester (GB); Stephen J. Till, Worcester (GB); William J. Feast, Durham (GB); Richard J. Peace, Bedford (GB). CONDUCTING POLYMERS. Patent dated Apr. 6, 2004. Disclaimer filed Dec. 6, 2004, by the Assignee, QinetiQ Limited.

Hereby enters this disclaimer to claim 1-2, of said patent.

*(Official Gazette May 10, 2005)*